United States Patent [19]

Eng

[11] Patent Number: 4,785,207

[45] Date of Patent: Nov. 15, 1988

[54] LEAKAGE REGULATOR CIRCUIT FOR A FIELD EFFECT TRANSISTOR

[75] Inventor: John E. Eng, Buena Park, Calif.

[73] Assignee: Hughes Aircraft Company, Los Angeles, Calif.

[21] Appl. No.: 5,716

[22] Filed: Jan. 21, 1987

[51] Int. Cl.$^4$ .............................................. H03K 17/16
[52] U.S. Cl. ................................... 307/577; 307/246; 307/296 R; 307/570; 307/584; 361/93; 363/89
[58] Field of Search ................. 307/200 B, 491, 246, 307/570, 572, 573, 575, 576–577, 579, 584, 585, 296 R, 297; 323/289; 361/93, 98; 363/89

[56] References Cited

U.S. PATENT DOCUMENTS

| | | | |
|---|---|---|---|
| 3,521,141 | 7/1970 | Walton | 307/577 X |
| 4,074,344 | 2/1978 | Pitel | 363/89 X |
| 4,360,744 | 11/1982 | Taylor | 307/570 X |
| 4,430,608 | 2/1984 | Nesler | 323/289 X |
| 4,446,390 | 5/1984 | Alaspa | 307/579 |
| 4,544,854 | 10/1985 | Ulmer et al. | 307/572 X |
| 4,590,456 | 5/1986 | Burton et al. | 307/585 X |
| 4,617,481 | 10/1986 | Masuda | 307/491 |
| 4,642,485 | 2/1987 | Cornellissen et al. | 307/575 X |
| 4,691,129 | 9/1987 | Einzinger et al. | 307/574 X |

Primary Examiner—Stanley D. Miller
Assistant Examiner—D. R. Hudspeth
Attorney, Agent, or Firm—S. M. Mitchell; M. J. Meltzer; A. W. Karambelas

[57] ABSTRACT

A leakage regulator for use with switching power supplies which include a field effect transistor (FET) is disclosed. The leakage regulator comprises a bias circuit coupled in a feedback arrangement with the FET to provide a self-generated bias voltage. The bias circuit includes a current transformer coupled to receive a drain-source leakage current. A bias voltage is generated from the transformed leakage current and this bias voltage is applied to the FET gate to help decrease the leakage current.

8 Claims, 1 Drawing Sheet

LEAKAGE REGULATOR CIRCUIT FOR A FIELD EFFECT TRANSISTOR

BACKGROUND OF THE INVENTION

The present ivvention relates generally to switching power supply circuits and more particularly to biasing circuits for field effect transistors.

Two of the primary concerns in providing electronic circuits to be flown on spacecraft such as communications satellites are weight minimization and power efficiency. Switching power supplies are used for operation of such communication satellites. Because of their ability to operate more efficiently and at higher switching frequencies than bipolar transistors, field effect transistors (FETs) in general and metal oxide semiconductor field effect transistors (MOSFETs) in particular are more desirable as switching elements for spacecraft switching power supplies. However, in a radiation environment like that of space, MOSFETs may fail to remain "off" when a driver circuit voltage is removed. This is because in a radiation environment, the characteristics of the semiconductor material of the FET change as a function of the accumulated total radiation dose. As a result, the threshold voltage or voltage at which the MOSFET begins to turn on or conduct is reduced as the MOSFET is exposed to cumulative amounts of radiation. Prior art spacecraft switching power supplies have used a separate power converter to supply a bias voltage to the gate electrode of the MOSFETs in the main power supply to prevent such a leakage current when the main power supply is in the "off" state. This extra power converter adds extra weight and increases the space requirements for the switching power supplies.

OBJECTS OF THE INVENTION

It is therefore a primary object of the present invention to provide a MOSFET bias circuit which is not subject to the foregoing problems and disadvantages.

It is another object of the present invention to provide a MOSFET bias curcuit for a spacecraft switching power supply which does not require a separate power converter to provide a bias vltage.

It is a further object of the present invention to provide a MOSFET bias circuit which has improved power and weight efficiency.

SUMMARY OF THE INVENTION

The foregoing objects of the invention are achieved by means of a leakage regulator coupled in a feedback configuration with a MOSFET of a switching power supply. More specifically, a current converter is coupled in series with the MOSFET such that when the power supply is "off", any drain-source leakage current flows through the primary coil of the current transformer. A capacitor is coupled in parallel with the secondary coil of the current transformer to store a bias voltage generated by the secondary current. This capacitor is coupled to the gate electrode of the MOSFET to bias the gate and thereby reduce drain-source leakage current. In this manner the drain-source leakage current of the MOSFET is used to generate a gate bias voltage which decreases the leakage current without the need for an external biasing power source. Means are provided for effectively shorting out the current transformer when the switching power supply is "on" and operating normally.

These and other objects of the present invention, together with the features and advantages thereof, will become apparent from the following detailed specification, when considered in conjunction with the accompanying drawings.

DETAILED DESCRIPTION OF THE INVENTION

Figure 1:
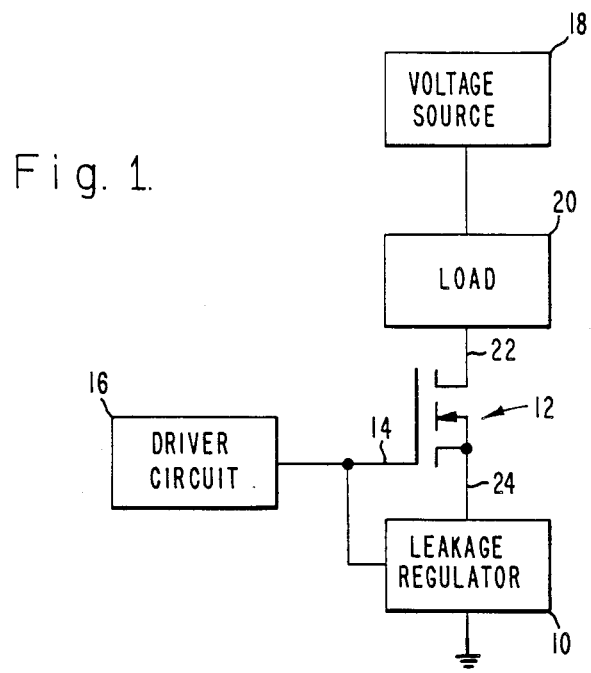
FIG. 1 is a schematic diagram of the general concept of the present invention.

FIG. 1 is a schematic diagram showing the general concept of the present invention with a leakage regulator 10 configured in a feedback arrangement with an FET 12 to provide a negative bias voltage to the gate electrode 14 of FET 12. A negative bias voltage is required for the n-channel FET shown, but the present invention will work equally well by supplying a positive bias voltage to the gate of a p-channel device. As shown, a driver circuit 16 provides control signals to turn FET 12 "on" or "off" via FET gate electrode 14. When FET 12 is on, a voltage source 18 is coupled through a load 20 to ground.

Under certain conditions, particularly upon exposure to a radiation environment, a leakage current will develop in FET 12 from a drain electrode 22 to a source electrode 24 due to a decrease in the MOSFET's threshold voltage. Leakage regulator 10 uses this drain-source leakage current to generate a negative bias voltage at gate electrode 14 which causes the leakage current to decrease. Thus, leakage regulator 10 provides a feedback negative bias voltage to gate 14 to help maintain FET 12 in an "off" condition.

Figure 2:
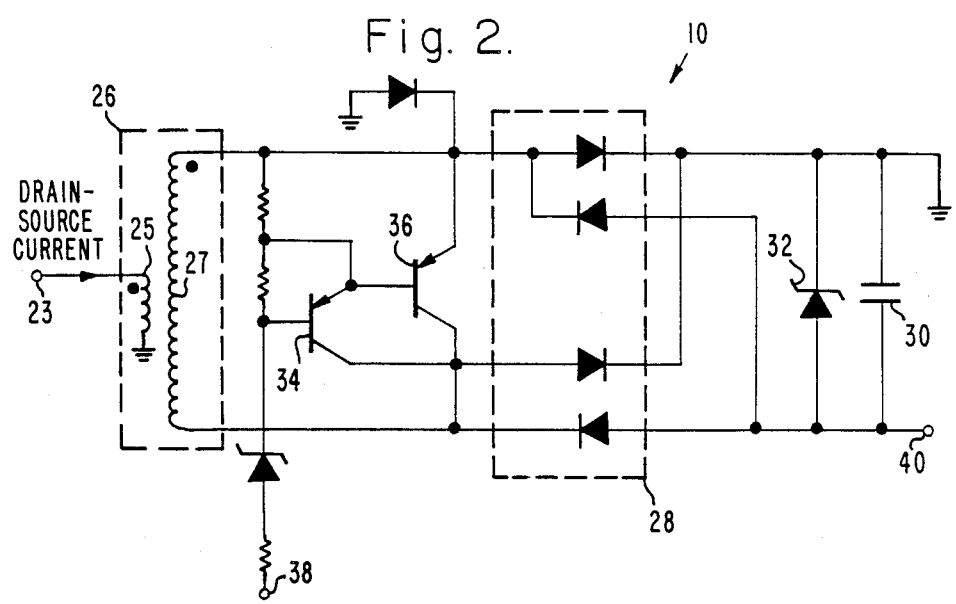
FIG. 2 is a schematic diagram of the bias circuit of the present invention.

FIG. 2 is a schematic diagram of a preferred embodiment of the FET bias circuit comprising leakage regulator 10. A primary coil 25 of a current transformer 26 is connected by an input terminal 23 to the source electrode 24 of FET 12 to receive the drain-source leakage current. A secondary coil 27 of transformer 26 is coupled in parallel through a diode bridge 28 to a capacitor 30. A zener diode 32 is coupled in parallel with capacitor 30. A Darlington arrangement of a pair of transistors 34, 36 is used to short out leakage regulator 10 when the power supply is turned "on" and a voltage is applied to a terminal 38. The bias voltage representing a negative source-gate voltage is provided at a terminal 40 which is coupled to gate electrode 14.

In operation, when a device such as FET 12 is exposed to radiation, its voltage threshold may be affected causing a drain-source leakage current to develop. By channeling this drain-source leakage current through current transformer 26, a secondary current is developed to generate a voltage on capacitor 30. Ihe charge developed on capacitor 30 is coupled to FET gate electrode 14 through output terminal 40 to reverse bias FET 12 and prevent or decrease the leakage current Zener diode 32 prevents the voltage on capacitor 30 from exceeding the desired safe level for biasing FET 12. As the leakage current decreases or stops, diode bridge 28 functions to reset the transformer core of transformer 26. When the power supply is turned on, a negative voltage is fed back from the power supply to terminal 38 in order to short out leakage regulator 10.

Thus, driver circuit 16 does not have to constantly overcome the negative bias voltage applied to gate 14 and the efficiency of the circuit is improved. The voltage at terminal 38 generates a current to turn on transistors 34 and 36 and thereby short out the secondary winding 27 of the current transformer 26 so that the voltage drop across the primary winding is minimized.

It will be appreciated by those skilled in the art that the principles of the present invention may be used with any type of field effect transistor or other deveice which has its voltage threshold affected by radiation. Also, it will be appreciated that the leakage regulator could be positioned between the voltage source and drain electrode to provide a drain-gate bias voltage. Additionally, other means for generating the bias voltage from the leakage current, such as a resistor, could be used. Thus, while the present invention has been shown and described with reference to a preferred embodiment, it will be understood that numerous modifications, changes, variations, substitutions and equivalents will now occur to those skilled in the art without departing from the spirit and scope of the invention. Accordingly, it is intended that the invention herein be limited only by the scope of the appended claims.

What is claimed is:

1. An FET bias circuit for providing a bias voltage to an FET having a gate, a source and a drain to reduce drain-source leakage current in said FET, said circuit comprising:
   a current transformer, coupled in series with said FET, for generating said bias voltage in response to the leakage current; and
   means for coupling said bias voltage from said generating means to said FET gate.

2. The bias circuit of claim 1, wherein said FET is an n-channel MOSFET and said current transformer is coupled between said source and a ground terminal.

3. The bias circuit of claim 1, wherein said FET is an n-channel MOSFET and said current transformer is coupled between said drain and a voltage supply.

4. The bias circuit of claim 1, and further comprisinq a capacitor coupled in parallel with the secondary side of said current transformer for storing a charge from said transformer to provide said bias voltage, and wherein one side of said capacitor is coupled to said FET gate.

5. The bias circuit of claim 4, and further including means coupled in parallel with said transformer secondary for shorting-out said transformer when said FET is turned on.

6. A method for reducing drain-source leakage current in an FET having a gate, a source and a drain, comprising the steps of:
   generating a bias voltage in response to the leakage current using a current transformer coupled in series with said FET to receive the drain-source leakage current; and
   applying said bias voltage to said gate of said FET.

7. The method of claim 6 and further including the step of shorting out said current transformer when said FET is turned on.

8. The method of claim 6, wherein said FET is an N-channel MOSFET.

* * * * *